(12) United States Patent  (10) Patent No.: US 8,222,122 B2
Shin et al.                  (45) Date of Patent:     Jul. 17, 2012

(54) METHOD OF FORMING NONVOLATILE MEMORY DEVICE

(75) Inventors: Seungmok Shin, Yongin-si (KR); Soodoo Chae, Yongin-si (KR); JinGyun Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 143 days.

(21) Appl. No.: 12/725,885

(22) Filed: Mar. 17, 2010

(65) Prior Publication Data

US 2010/0248457 A1    Sep. 30, 2010

(30) Foreign Application Priority Data

Mar. 31, 2009  (KR) .......................... 10-2009-0027715

(51) Int. Cl.
*H01L 21/20*    (2006.01)
(52) U.S. Cl. ............ 438/478; 438/229; 216/51; 216/41; 257/E21.679; 257/E21.614
(58) Field of Classification Search .................. 438/478, 438/739, 591, 229; 216/51, 41, 7; 257/E21.41, 257/E21.648, E21.19, E21.679, E21.614, 257/E21.613
See application file for complete search history.

(56) References Cited

U.S. PATENT DOCUMENTS

| 7,821,058 | B2* | 10/2010 | Kidoh et al. ................... 257/324 |
| 2004/0205958 | A1* | 10/2004 | Grynkewich et al. ....... 29/603.14 |
| 2004/0211749 | A1* | 10/2004 | Grynkewich et al. ............. 216/2 |
| 2006/0138595 | A1* | 6/2006 | Kiyotoshi ........................ 257/532 |
| 2007/0252201 | A1* | 11/2007 | Kito et al. ....................... 257/331 |
| 2008/0073635 | A1* | 3/2008 | Kiyotoshi et al. ................. 257/2 |
| 2008/0084729 | A1 | 4/2008 | Cho et al. |
| 2008/0173932 | A1* | 7/2008 | Kidoh et al. .................... 257/324 |
| 2011/0101443 | A1* | 5/2011 | Huo et al. ....................... 257/324 |

FOREIGN PATENT DOCUMENTS

| JP | 2003-078044 | 3/2003 |
| JP | 2007-266143 | 10/2007 |
| JP | 2008-078404 | 4/2008 |
| KR | 1020080027162 | 3/2008 |
| KR | 1020080033051 | 4/2008 |

* cited by examiner

*Primary Examiner* — Caridad Everhart
(74) *Attorney, Agent, or Firm* — F. Chau & Associates, LLC

(57) ABSTRACT

Provided is a method of forming a nonvolatile memory device. The method may include alternatingly stacking n number of dielectric layers and n number of conductive layers on a substrate, forming a non-photosensitive pattern on the alternatingly stacked dielectric layers and conductive layers, etching the i-th conductive layer and i-th dielectric ($2 \leq i \leq n$, i is a natural number indicating a stacking order of the conductive layers and the dielectric layers) by using the non-photosensitive pattern as an etch mask, laterally etching a sidewall of the non-photosensitive pattern and etching the i-th conductive layer, (i−1)-th conductive layer, i-th dielectric layer and (i−1)-th dielectric layer by using the etched non-photosensitive pattern as an etch mask.

19 Claims, 14 Drawing Sheets

METHOD OF FORMING NONVOLATILE MEMORY DEVICE

CROSS-REFERENCE TO RELATED APPLICATIONS

This U.S. non-provisional patent application claims priority under 35 U.S.C. §119 to Korean Patent Application No. 10-2009-0027715, filed on Mar. 31, 2009, the entire disclosure of which is hereby incorporated by reference herein in it's entirety.

BACKGROUND OF THE INVENTION

The present disclosure herein relates to a method of forming a memory device, and more particularly, to a method of forming a nonvolatile memory device.

With the trend towards multi-functionality and miniaturization of electronic devices, higher integration of memory devices built into these electronic devices may now be required. To realize higher integration of memory devices, elements constituting a memory device should be formed with smaller dimensions and should be disposed with narrower spacing. For these purposes, elements should be formed with finer patterns. However, as expensive equipment may be required to form these finer patterns, the forming of these finer patterns may have high process costs associated herewith. Also, higher integration of fine patterns using expensive equipment may reach a certain limit.

SUMMARY OF THE INVENTION

The present disclosure provides a method of forming a nonvolatile memory device optimized for higher integration.

The present disclosure also provides a method of forming a nonvolatile memory device with process accuracy.

In accordance with an exemplary embodiment of the present disclosure, a method of forming a nonvolatile memory device is provided. The method includes alternatingly stacking n number of dielectric layers and n number of conductive layers on a substrate, forming a non-photosensitive pattern on the alternatingly stacked dielectric layers and conductive layers, etching the i-th conductive layer and i-th dielectric layer by using the non-photosensitive pattern as an etch mask, wherein $2 \leq i \leq n$, i is a natural number indicating a stacking order of the conductive layers and the dielectric layers, laterally etching a sidewall of the non-photosensitive pattern and etching the i-th conductive layer, (i−1)-th conductive layer, i-th dielectric layer and (i−1)-th dielectric layer by using the etched non-photosensitive pattern as an etch mask.

In some embodiments, the above method may further include forming a photosensitive pattern on the alternatingly stacked dielectric layers and conductive layers. The non-photosensitive pattern may be formed in a spacer shape on a sidewall of the photosensitive pattern.

In other embodiments, the non-photosensitive pattern may have a hardness which is higher than that of the photosensitive pattern.

In still other embodiments, the forming of the non-photosensitive pattern may include: forming a non-photosensitive layer covering the photosensitive pattern and anisotropically etching the non-photosensitive layer until a top surface of the photosensitive pattern is exposed.

In even other embodiments, the non-photosensitive layer may have a thickness which is equal to a sum of thicknesses of the alternatingly stacked dielectric layers and conductive layers.

In yet other embodiments, the laterally etching of the sidewall of the non-photosensitive pattern and the etching of the conductive layers and the dielectric layers using the etched non-photosensitive pattern as an etch mask may be repeatedly performed until the sidewall of the photosensitive pattern becomes coplanar with a sidewall of the uppermost conductive layer or dielectric layer.

In further embodiments, the above method may further include: forming an active pattern which penetrates the dielectric layers and the conductive layers to extend upward from a surface of the substrate and forming a data storage pattern between the active pattern and the conductive layers.

In still further embodiments, the non-photosensitive pattern may be an inorganic dielectric pattern.

In even further embodiments, wherein the etching of the non-photosensitive pattern comprises isotropically etching the non-photosensitive pattern In accordance with another exemplary embodiment of the present invention, a method of forming a nonvolatile memory device is provided. The method includes alternatingly stacking n number of dielectric layers and n number of conductive layers on a substrate, wherein n>2, and n is a natural number, forming a non-photosensitive pattern on the alternatingly stacked dielectric layers and conductive layers, etching an i-th conductive layer and an i-th dielectric layer by using the non-photosensitive pattern as an etch mask, wherein $2 \leq i \leq n$, and i is a natural number indicating a stacking order of the conductive layers and the dielectric layers, laterally etching a sidewall of the non-photosensitive pattern and etching the i-th conductive layer, (i−1)-th conductive layer, i-th dielectric layer and (i−1)-th dielectric layer by using the etched non-photosensitive pattern as an etch mask. In addition, the method further includes forming an interlayer dielectric covering the etched conductive layers and the etched dielectric layers, forming an opening penetrating the interlayer dielectric, the conductive layers and the dielectric layers, forming a data storage pattern on a sidewall of the opening, forming an active pattern in the opening in which the data storage pattern is formed, forming interconnection contacts by partially removing the interlayer dielectric to form contact holes therein and filling an inside the contact holes with a conductive material and forming interconnections on the active pattern and the interconnection contacts.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

Preferred embodiments of the present disclosure will be described below in more detail with reference to the accompanying drawings. The present disclosure may, however, be embodied in different forms and should not be constructed as limited to the embodiments set forth herein. As used herein, the term "and/or" includes any and all combinations of one or more of the associated listed items. In the specification, it will be understood that when a layer (or layer) is referred to as being 'on' another layer or substrate, it can be directly on the other layer or substrate, or intervening layers may also be present. Also, though terms like "first", "second", etc. are used to describe various regions and layers in various embodiments of the present disclosure, the regions and the layers are not limited to these terms. Although spatial terms such as "upper" and "lower" are used to express elements or parts, these ten is are spatially relative terms used for illustrative purposes only, and thus positional relationships of elements or parts are not limited by these terms. In addition, the thicknesses of the elements and the relative thicknesses between elements may be exaggerated for further clarity of embodiments of the inventive concept.

A method of forming a nonvolatile memory device according to an embodiment of the inventive concept will now be described with reference to FIGS. 1 through 6.

Figure 1:
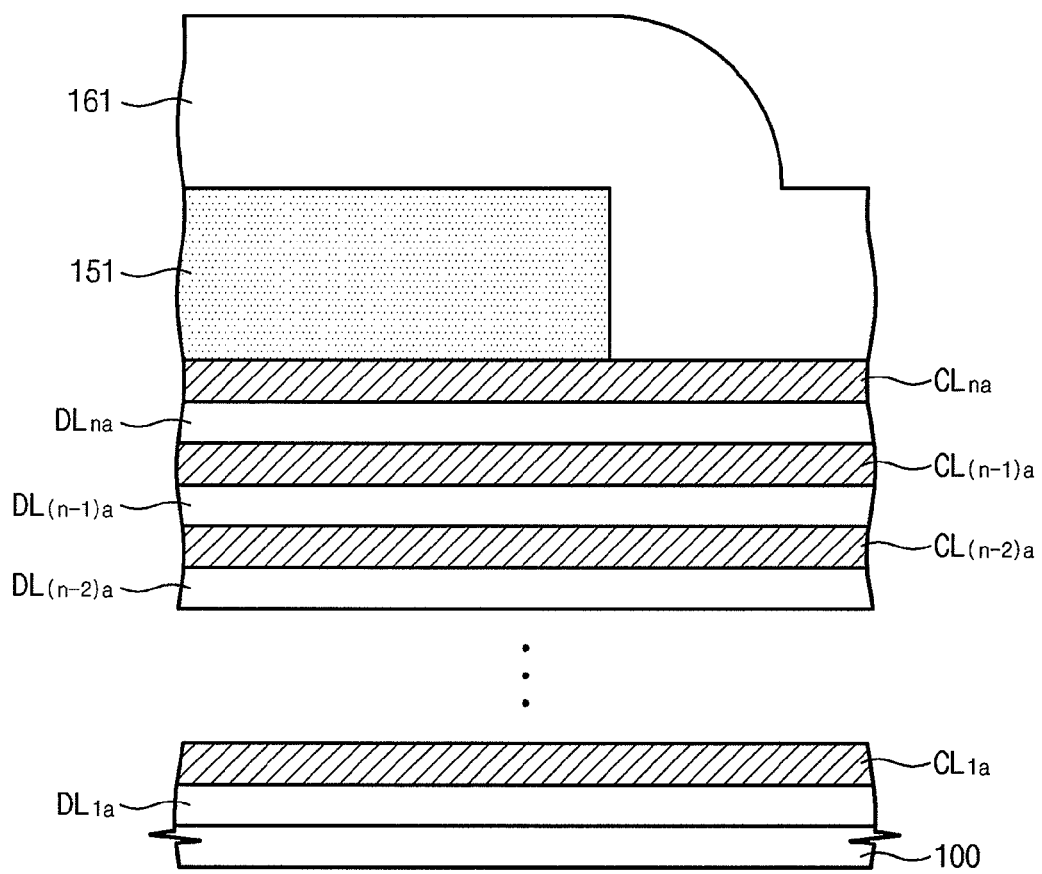
FIGS. 1 through 6 are partial sectional views for describing a method of forming a nonvolatile memory device according to an exemplary embodiment of the inventive concept.

Referring to FIG. 1, n number of conductive layers CLna, CL(n-1)a, CL(n-2)a, . . . , CL1a and n number of dielectric layers DLna, DL(n-1)a, DL(n-2)a, . . . , DL1a (where n is a natural number of 2 or more) may be alternatingly stacked on a substrate 100. The n number of conductive layers CLna, CL(n-1)a, CL(n-2)a, . . . , CL1a and the n number of dielectric layers DLna, DL(n-1)a, DL(n-2)a, . . . , DL1a may be formed on a cell region of the substrate 100 and on a connection region connecting the cell region and a peripheral circuit region. The stacking order of the conductive layers and the dielectric layers may be opposite to that shown in FIG. 1. That is, embodiments of the inventive concept may include all of first forming the first conductive layer CL1a and first forming the first dielectric layer DL1a.

The n number of conductive layers CLna, CL(n-1)a, CL(n-2)a, . . . , CL1a may have substantially the same thickness. Also, the n number of conductive layers CLna, CL(n-1)a, CL(n-2)a, . . . , CL1a may include materials having the same etch rate under the same etch condition. For example, the n number of conductive layers CLna, CL(n-1)a, CL(n-2)a, . . . , CL1a may include the same conductive material.

The n number of dielectric layers DLna, DL(n-1)a, DL(n-2)a, . . . , DL1a may have substantially the same thickness. Also, the n number of dielectric layers DLna, DL(n-1)a, DL(n-2)a, . . . , DL1a may include materials having the same etch rate under the same etch condition. For example, the n number of dielectric layers DLna, DL(n-1)a, DL(n-2)a, . . . , DL1a may include the same dielectric material.

A photosensitive pattern 151 may be formed on a stack structure including the n number of conductive layers CLna, CL(n-1)a, CL(n-2)a, . . . , CL1a and the n number of dielectric layers DLna, DL(n-1)a, DL(n-2)a, . . . , DL1a. For example, the forming of the photosensitive pattern 151 may include forming a photosensitive layer on the stack structure including the n number of conductive layers CLna, CL(n-1)a, CL(n-2)a, . . . , CL1a and the n number of dielectric layers DLna, DL(n-1)a, DL(n-2)a, . . . , DL1a, pre-baking the photosensitive layer, performing an exposure and developing process with respect to the prebaked photosensitive layer, and performing a post baking with respect to the developed photosensitive layer. The photosensitive pattern 151 may include, for example, an organic material.

A non-photosensitive layer 161 may be formed on the photosensitive pattern 151. The non-photosensitive layer 161 may be formed, for example, so as to cover a top surface and sidewall surfaces of the photosensitive pattern 151. In an embodiment, the non-photosensitive layer 161 may have substantially the same thickness as a sum of thicknesses of the n number of conductive layers CLna, CL(n-1)a, CL(n-2)a, . . . , CL1a and the n number of dielectric layers DLna, DL(n-1)a, DL(n-2)a, . . . , DL1a.

The non-photosensitive layer 161 may be formed of, for example, a room temperature oxide. For example, the non-photosensitive layer 161 may be formed at a temperature lower than a temperature for baking the photosensitive material when forming the photosensitive pattern. By doing so, damage to the photosensitive pattern 151 can be minimized while the non-photosensitive layer 161 is formed.

The non-photosensitive layer 161 may include, for example, an inorganic dielectric material. The non-photosensitive layer 161 may include, for example, oxide, nitride or a combination thereof. The non-photosensitive layer 161 may have a hardness higher than that of the photosensitive pattern 151. That is, the non-photosensitive layer 161 may be less soft than the photosensitive pattern 151.

By partially removing the non-photosensitive layer 161, a non-photosensitive pattern 162a is formed. For example, the non-photosensitive layer 161 may be anisotropically etched until the top surface of the photosensitive pattern 151 is exposed. The non-photosensitive pattern 162a may be formed, for example, in a spacer shape on the sidewall of the photosensitive pattern 151.

According to an embodiment of the inventive concept, the i-th dielectric layer and the i-th conductive layer are etched by using the non-photosensitive pattern 162a and the photosensitive pattern 151, and then the non-photosensitive pattern 162a is laterally etched. Thereafter, the i-th conductive layer and the i-th dielectric layer, and the (i-1)-th conductive layer and the (i-1)-th dielectric layer are etched by using the etched non-photosensitive pattern as an etch mask. The i-th dielectric layer/conductive layer indicates any one of the second dielectric layer/conductive layer to the n-th dielectric layer/conductive layer.

Figure 2:
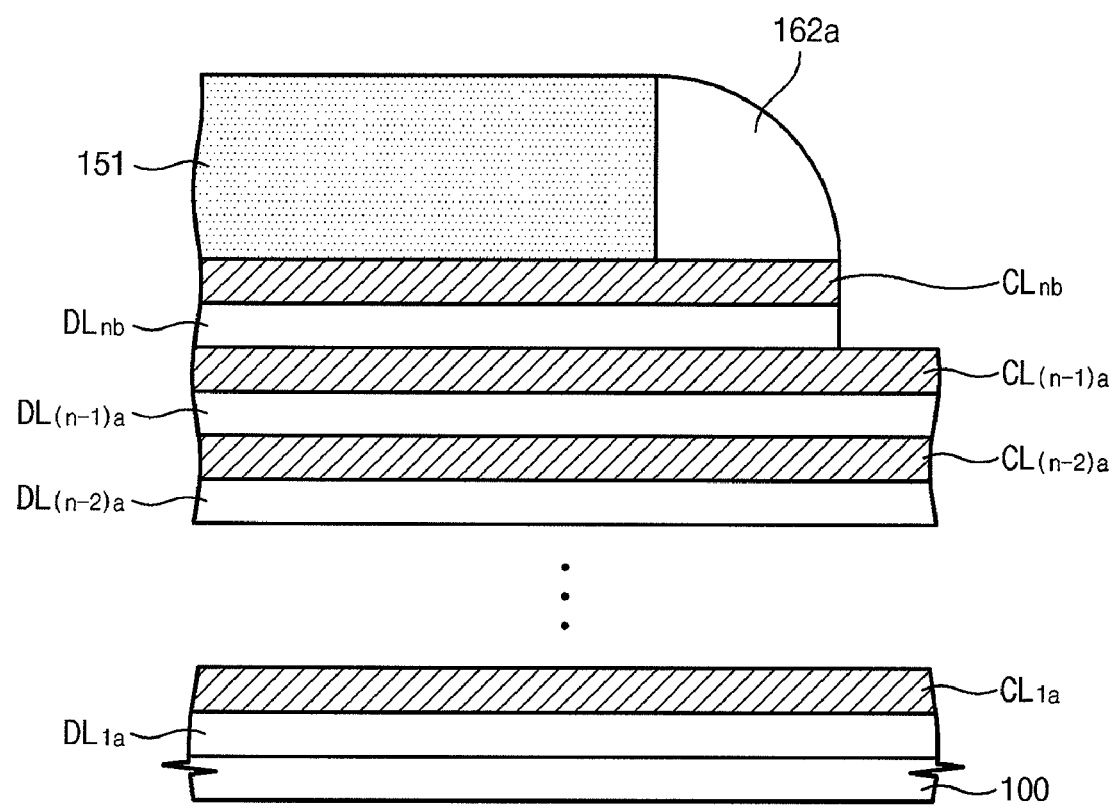

Referring to FIG. 2, a first etch process is performed with respect to the i-th conductive layer and the i-th dielectric layer by using the non-photosensitive pattern 162a and the photosensitive pattern 151 as an etch mask. The letter 'i' indicates a stacking order of a conductive layer and/or dielectric layer etched. The letter 'i' is greater than or equal to 2 and less than or equal to n. In this embodiment, for convenience of description, a case where the n-th stack layer is etched (e.g., i=n) will be described.

The first etch process may include etch processes continuously performed. Concretely, the first etch process may include etching the n-th conductive layer CLna and etching the n-th dielectric layer DLna by using the non-photosensitive pattern 162a and the photosensitive pattern 151 as an etch mask. The etching of the n-th conductive layer CLna and the etching of the n-th dielectric layer DLna may be performed by, for example, an anisotropic etch process. The n-th conductive layer CLnb and the n-th dielectric layer DLnb etched by the first etch process may have sidewalls self-aligned with a sidewall of the non-photosensitive pattern 162a. By doing so, a top surface of the (n-1)-th conductive layer CL(n-1)a adjacent to the etched n-th dielectric layer DLnb may be partially exposed.

Figure 3:
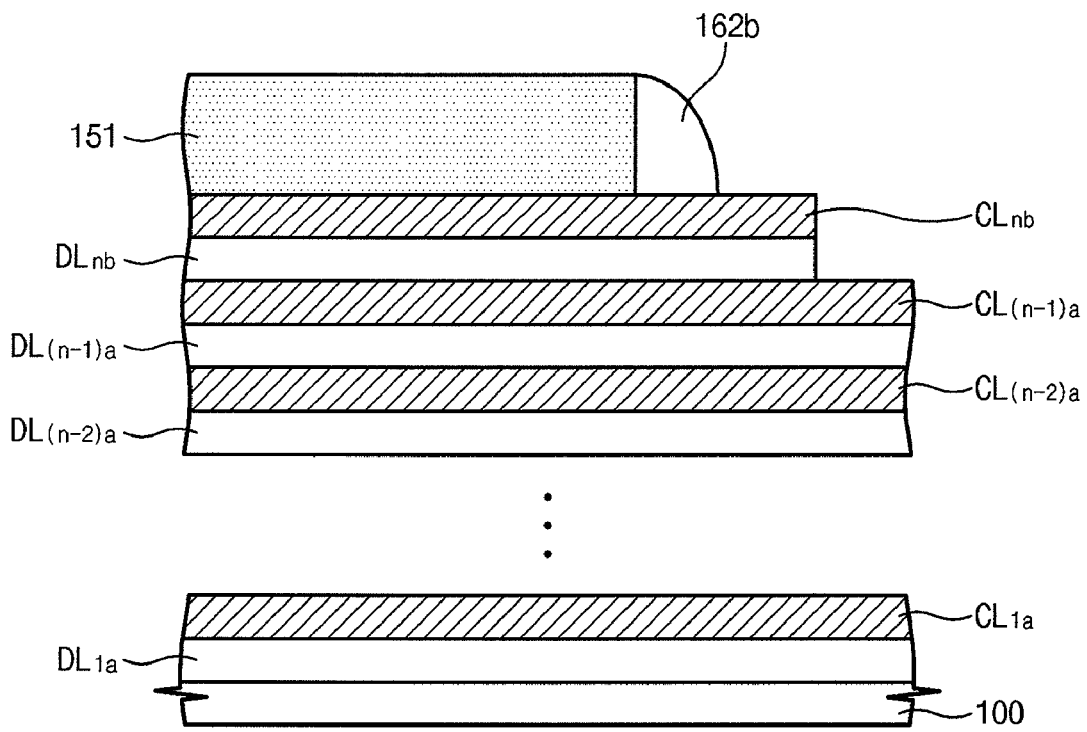

Referring to FIG. 3, the non-photosensitive pattern 162a may be etched. The etching of the non-photosensitive pattern 162a may include, for example, an isotropic etch. The etched non-photosensitive pattern 162b may have a sidewall laterally moved from the sidewall of the non-photosensitive pattern 162a. The etch amount of the non-photosensitive pattern 162a may be determined by, for example, a critical dimension (CD) of an interconnection contact region to be described later. As the etch amount of the non-photosensitive pattern 162a increases, the area of an interconnection contact region to be formed later may increase too. As the sidewall of the non-photosensitive pattern 162a moves, a top surface of the etched conductive layer CLnb may be partially exposed.

Figure 4:
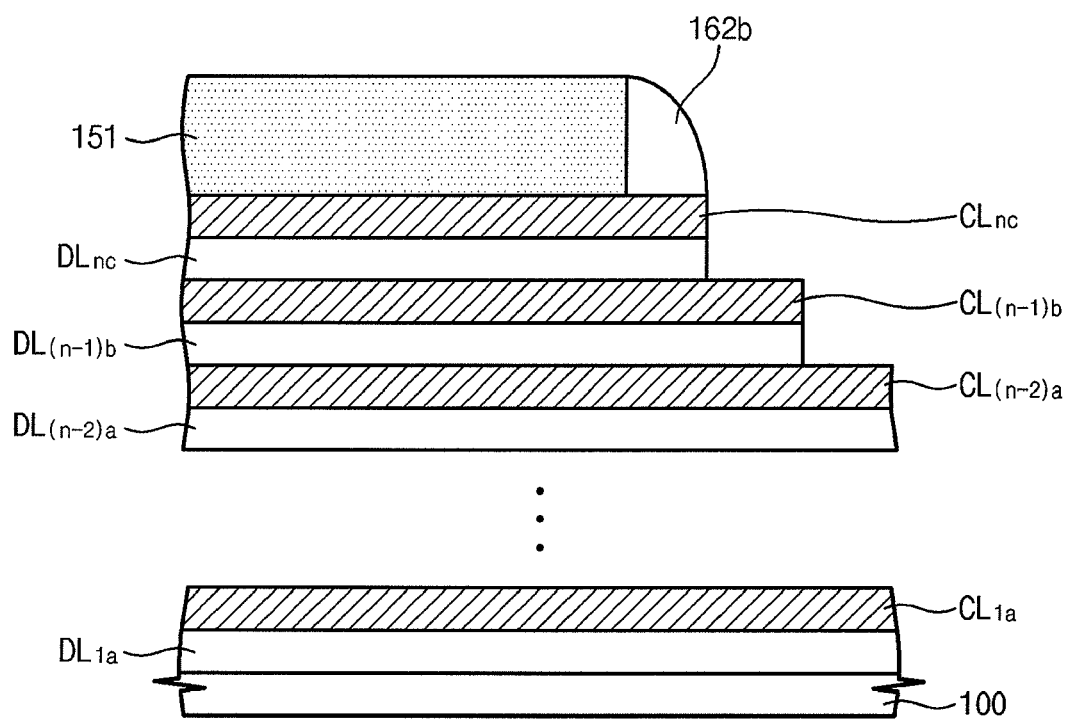

Referring to FIG. 4, a second etch process is performed with respect to the conductive layers CLnb, CL(n−1)a and dielectric layers DLnb, DL(n−1)a having the exposed top surfaces. The second etch process includes etching the conductive layers CLnb, CL(n−1)a having the top surfaces exposed as a result of the etching of the non-photosensitive pattern 162a. Also, the second etch process includes etching the dielectric layers DLnb, DL(n−1)a having the top surfaces exposed as a result of the etching of the conductive layers CLnb, CL(n−1)a.

Concretely, the n-th conductive layer CLnb may be etched by using the etched non-photosensitive pattern 162b as an etch mask. The etched n-th conductive layer CLnc may have a sidewall self-aligned with the etched non-photosensitive pattern 162b. While the n-th conductive layer CLnb is etched, the (n−1)-th conductive layer may also be etched together therewith. The sidewall of the etched (n−1)-th conductive layer CL(n−1)b may be self-aligned with the sidewall of the n-th dielectric layer DLnb etched by the first etch process.

Thereafter, the n-th dielectric layer DLnb may be etched. While the n-th dielectric layer DLnb is etched, the (n−1)-th dielectric layer DL(n−1)a may also be etched together therewith. By doing so, the sidewall of the etched n-th dielectric layer DLnc is self-aligned with the sidewall of the etched n-th conductive layer CLnc. Also, the sidewall of the etched (n−1)-th dielectric layer DL(n−1)b is self-aligned with the sidewall of the etched (n−1)-th conductive layer CL(n−1)b.

Thereafter, the first etch process, the etching of the non-photosensitive pattern 162b and the second etch process are repeatedly performed as aforementioned. The non-photosensitive pattern 162b may be removed by repeated etch processes. According to an embodiment, in a last etch process for forming an interconnection contact region, the photosensitive pattern 151 may be used as an etch mask. For this purpose, the photosensitive pattern 151 may be formed with a width which is substantially the same as a width of the uppermost conductive layer CLn of a final structure.

Figure 5:
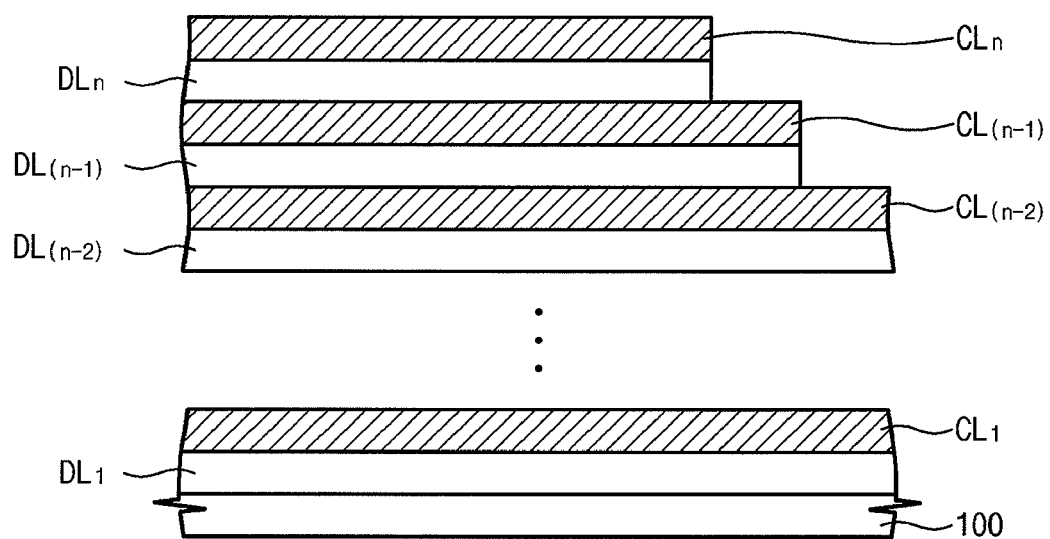

Referring to FIG. 5, by the foregoing two or more etch processes, stepwise conductive layers CLn, CLn−1, CLn−2, . . . , CL1 and stepwise dielectric layers DLn, DLn−1, DLn−2, . . . , DL1 are formed. Top surfaces of the respective conductive layers CLn, CLn−1, CLn−2, . . . , CL1 may be partially exposed. The exposed top surfaces may be interconnection contact regions for the respective conductive layers CLn, CLn−1, CLn−2, . . . , CL1. Areas of the interconnection contact regions may be determined, based upon, for example, thicknesses of contacts connected with the conductive layers and other process margins. The areas of the interconnection contact regions may be adjusted by an etched thickness of the non-photosensitive pattern. Concretely, the etched thickness of the non-photosensitive pattern may be substantially the same as the width of the interconnection contact region.

The conductive layers and the dielectric layers etched by the etch processes may have, for example, a stepwise shape. For example, the n-th conductive layer CLn and the n-th dielectric layer DLn constitute an n-th layer, and the (n−1)-th conductive layer CL(n−1) and the (n−1)-th dielectric layer DL(n−1) having a sidewall laterally protruded from the sidewall of the n-th layer may be disposed below the n-th layer. Widths of the (n−1)-th conductive layer CL(n−1) and the (n−1)-th dielectric layer DL(n−1) may be greater than widths of the n-th conductive layer CLn and the n-th dielectric layer DL(n−1).

According to embodiment of the inventive concept, by performing etch processes, which use a non-photosensitive pattern and a conductive layer and/or dielectric layer as an etch mask, the conductive layer and/or dielectric layer being etched by using the non-photosensitive pattern, interconnection contact regions may be formed on the conductive layers. Areas of the interconnection contact regions may be readily adjusted by the non-photosensitive pattern and the thickness of the etched non-photosensitive pattern. Accordingly, a desired interconnection contact region can be readily secured.

Also, by a method of forming a nonvolatile memory device according to embodiments of the inventive concept, the interconnection contact region can be precisely formed on a desired region. In the case of etching a photosensitive pattern and etching a layer by again using the etched photosensitive pattern as an etch mask, an interconnection contact region may not be precisely formed on the etched layer. This may be due to a fact that the hardness of the photosensitive pattern is lower than that of the non-photosensitive pattern. In general, the photosensitive pattern may not be harder than the non-photosensitive pattern. Therefore, the photosensitive pattern may not be etched in the desired size and shape. Also, the etched photosensitive pattern may be deformed and not maintain a shape as etched. If a layer is etched by using the deformed photosensitive pattern as an etch mask, the layer may be etched in a shape different from a desired shape. That is, the accuracy of the etch process may be lowered significantly.

However, in the case where etch processes are performed by sequentially moving the sidewall of the non-photosensitive pattern according to embodiments of the inventive concept, etch masks may be formed in a desired thickness and shape due to the high hardness of the non-photosensitive pattern. Also, the shape of the non-photosensitive pattern may be readily maintained. Therefore, the accuracy in etch process using these etch masks may be significantly enhanced. In addition, the enhanced accuracy in etch process makes it possible to form a nonvolatile memory device with higher integration.

Figure 6:
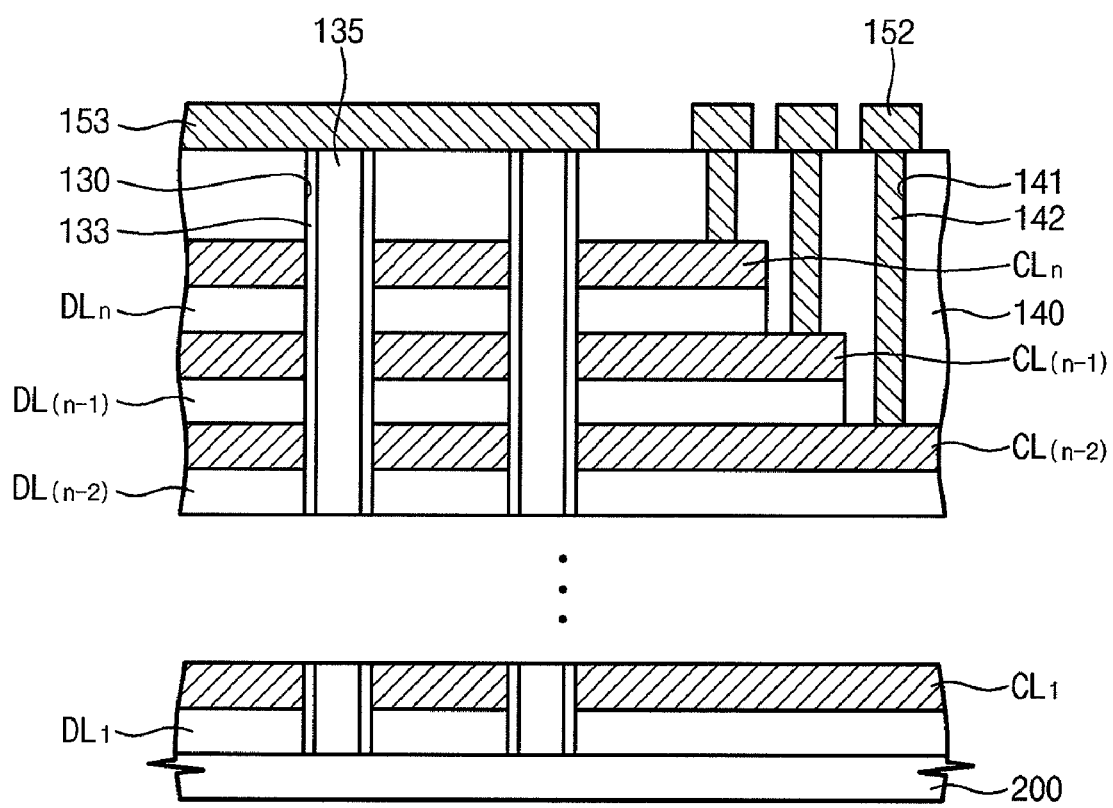

Referring to FIG. 6, an interlayer dielectric 140 covering the conductive layers CLn, CLn−1, CLn−2, . . . , CL1 and the dielectric layers DLn, DLn−1, DLn−2, . . . , DL1 is formed. An openings 130 penetrating the interlayer dielectric 140, the conductive layers CLn, CLn−1, CLn−2, . . . , CL1 and the dielectric layers DLn, DLn−1, DLn−2, . . . , DL1 is formed.

A data storage pattern 133 is foamed on a sidewall of the opening 130. The data storage pattern 133 may include a blocking barrier adjacent to the sidewall of the opening 130, a charge storage layer on the blocking barrier, and a tunnel barrier on the charge storage layer. An active pattern 135 may be formed in the opening in which the data storage pattern 133 is formed. The active pattern 135 may include, for example, a Group 4A element. The Group 4A element may have, for example, a single crystalline or polycrystalline state. Unlike in the drawings, the active pattern 135 may not fully fill the opening 130. In this case, the active pattern 135 may be formed conformally on a sidewall of the data storage pattern 133 and a bottom of the opening 130 to define an inner space. The inner space may be filled with an insulating material.

By partially removing the interlayer dielectric 140, contact holes 141 exposing the interconnection contact regions of the conductive layers may be formed. Interconnection contacts 142 are formed by filling insides of the contact holes 141 with a conductive material. Thereafter, interconnections 153, 152 may be formed on the active pattern 135 and the interconnection contacts 142.

A nonvolatile memory device according to an embodiment of the inventive concept will now be described with reference to FIG. 6. Contents previously described with reference to FIGS. 1 through 6 may be partially omitted.

A plurality of conductive layers CLn, CLn–1, CLn–2, ..., CL1 and a plurality of dielectric layers DLn, DLn–1, DLn–2, ..., DL1 are alternatingly stacked on a substrate 100. The plurality of conductive layers CLn, CLn–1, CLn–2, ..., CL1 may have different widths. The plurality of conductive layers CLn, CLn–1, CLn–2, ..., CL1 and the plurality of dielectric layers DLn, DLn–1, DLn–2, ..., DL1 may be stacked in, for example, a stepwise shape. The conductive layer and the dielectric layer having the same stacking order may have the same width. The plurality of conductive layers CLn, CLn–1, CLn–2, ..., CL1 may function as gate electrodes of a nonvolatile memory device. The plurality of dielectric layers DLn, DLn–1, DLn–2, ..., DL1 may be intergate dielectrics electrically isolating the gate electrodes.

Each of the plurality of conductive layers CLn, CLn–1, CLn–2, ..., CL1 may have an exposed edge top surface. The exposed edge top surface may be an interconnection contact region for each of the plurality of conductive layers CLn, CLn–1, CLn–2, ..., CL1.

The plurality of conductive layers CLn, CLn–1, CLn–2, ..., CL1 and the plurality of dielectric layers DLn, DLn–1, DLn–2, ..., DL1 may be covered by an interlayer dielectric 140. The interlayer dielectric 140 may cover the uppermost layer among the plurality of conductive layers CLn, CLn–1, CLn–2, ..., CL1 and the plurality of dielectric layers DLn, DLn–1, DLn–2, ..., DL1.

An active pattern 135 penetrating the interlayer dielectric 140, the plurality of conductive layers CLn, CLn–1, CLn–2, ..., CL1 and the plurality of dielectric layers DLn, DLn–1, DLn–2, ..., DL1 is disposed on the substrate 100. The active pattern 135 may extend upward from a top surface of the substrate 100.

The data storage pattern 133 is interposed between the active pattern 135 and the plurality of conductive layers CLn, CLn–1, CLn–2, ..., CL1. The data storage pattern 133 may include a blocking barrier adjacent to the plurality of conductive layers CLn, CLn–1, CLn–2, ..., CL1, a tunnel barrier adjacent to the active pattern 135, and a charge storage layer between the blocking barrier and the tunnel barrier. One end of the active pattern 135 may be electrically connected with the substrate 100, and the other end thereof may be electrically connected with a bit line 153 on the interlayer dielectric 140.

Interconnections 152 are formed on the interlayer dielectric 140. The interconnections 152 may be electrically connected with interconnection contact regions of the plurality of conductive layers CLn, CLn–1, CLn–2, ..., CL1 through interconnection contacts 142. The interconnection contacts 142 may penetrate the interlayer dielectric 140.

A method of forming a nonvolatile memory device according to another embodiment of the inventive concept will now be described with reference to FIGS. 7 through 12.

Figure 7:
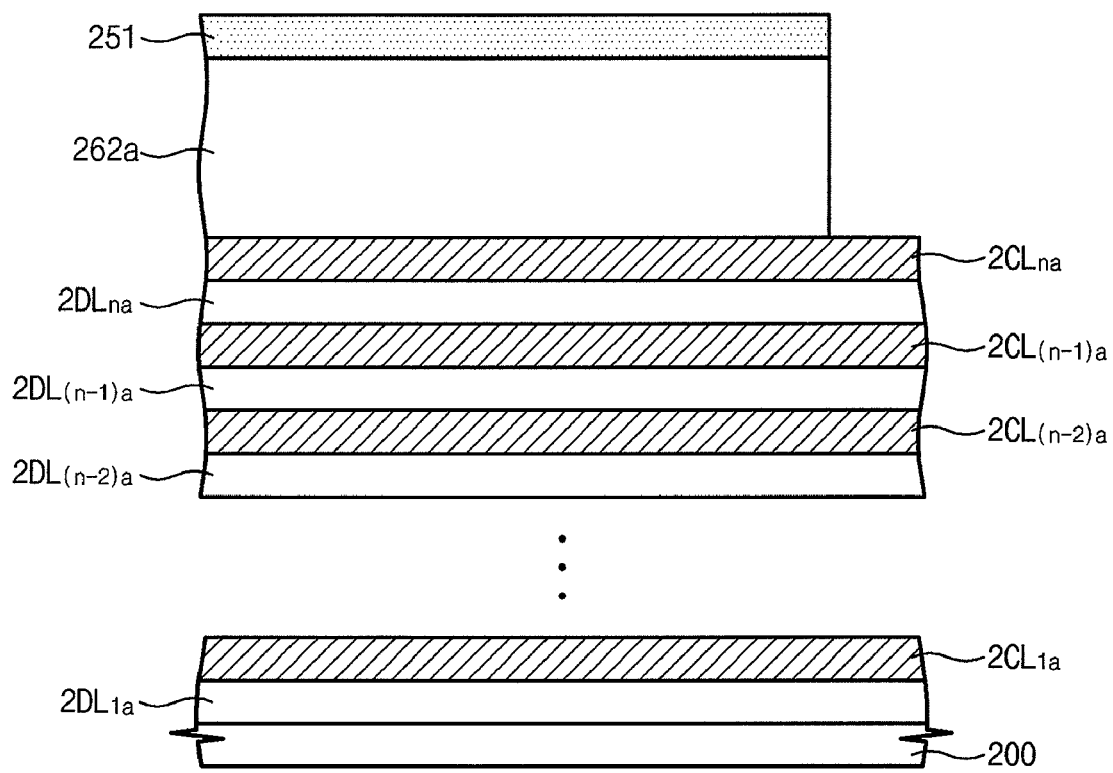
FIGS. 7 through 12 are partial sectional views for describing a method of forming a nonvolatile memory device according to an exemplary embodiment of the inventive concept.

Referring to FIG. 7, n number of conductive layers 2CLna, 2CL(n–1)a, 2CL(n–2)a, ..., 2CL1a and *n* number of dielectric layers 2DLna, 2DL(n–1)a, 2DL(n–2)a, ..., 2DL1a (where n is a natural number of 2 or more) may be stacked on a substrate 100. The n number of conductive layers 2CLna, 2CL(n–1)a, 2CL(n–2)a, ..., 2CL1a and the n number of dielectric layers 2DLna, 2DL(n–1)a, 2DL(n–2)a, ..., 2DL1a may be formed on a cell region of the substrate 100 and on a connection region connecting the cell region and a peripheral circuit region. Some of the conductive layers 2CLna, 2CL(n–1)a, 2CL(n–2)a, ..., 2CL1a and the dielectric layers 2DLna, 2DL(n–1)a, 2DL(n–2)a, ..., 2DL1a may extend to the peripheral circuit region. A stacking order of the conductive layers 2CLna, 2CL(n–1)a, 2CL(n–2)a, ..., 2CL1a and the dielectric layers 2DLna, 2DL(n–1)a, 2DL(n–2)a, ..., 2DL1a may be opposite to that shown in FIG. 7. That is, embodiments of the inventive concept include all of first stacking the first conductive layer 2CL1a and first forming the first dielectric layer 2DL1a.

The n number of conductive layers 2CLna, 2CL(n–1)a, 2CL(n–2)a, ..., 2CL1a may have substantially the same thickness. Also, the n number of conductive layers 2CLna, 2CL(n–1)a, 2CL(n–2)a, ..., 2CL1a may include materials having the same etch rate under the same etch condition. For example, the n number of conductive layers 2CLna, 2CL(n–1)a, 2CL(n–2)a, ..., 2CL1a may include the same conductive material.

The n number of dielectric layers 2DLna, 2DL(n–1)a, 2DL(n–2)a, ..., 2DL1a may have substantially the same thickness. Also, the n number of dielectric layers 2DLna, 2DL(n–1)a, 2DL(n–2)a, ..., 2DL1a may include materials having the same etch rate under the same etch condition. For example, the n number of dielectric layers 2DLna, 2DL(n–1)a, 2DL(n–2)a, ..., 2DL1a may include the same dielectric material.

A non-photosensitive layer is formed on a stack structure including the n number of conductive layers 2CLna, 2CL(n–1)a, 2CL(n–2)a, ..., 2CL1a and the n number of dielectric layers 2DLna, 2DL(n–1)a, 2DL(n–2)a, ..., 2DL1a. For example, the non-photosensitive layer may include at least one selected from the group of insulating materials including nitride and oxide. A photosensitive pattern 251 is formed on the non-photosensitive layer. For example, the photosensitive pattern 251 may be formed by coating a photosensitive material on the non-photosensitive layer and then performing processes such as baking, exposing, developing and the like with respect to the photosensitive layer.

The non-photosensitive layer is etched by using the photosensitive pattern 251 as an etch mask to form a non-photosensitive pattern 262a.

According to an embodiment of the inventive concept, the i-th dielectric layer and the i-th conductive layer are etched by using the non-photosensitive pattern 262a and the photosensitive pattern 251 as an etch mask, and then the non-photosensitive pattern 262a is laterally etched. Thereafter, the i-th conductive layer and the i-th dielectric layer, and the (i–1)-th conductive layer and the (i–1)-th dielectric layer are etched by using the etched non-photosensitive pattern as an etch mask. The i-th dielectric layer/conductive layer indicates any one of the second dielectric layer/conductive layer to the n-th dielectric layer/conductive layer.

Figure 8:
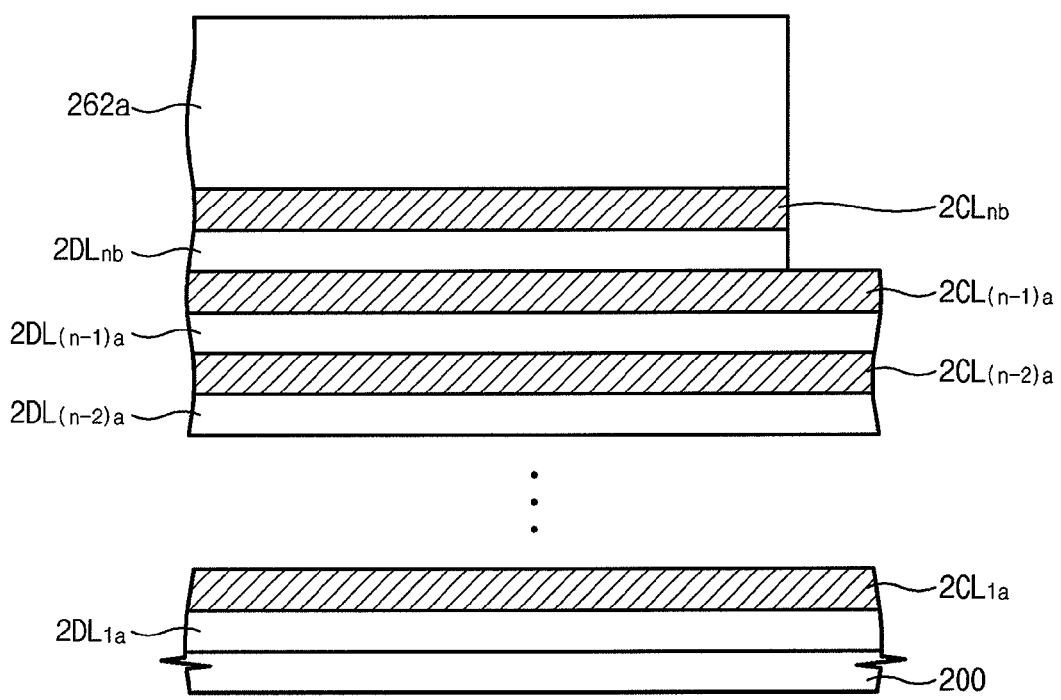

Referring to FIG. 8, a first etch process using the non-photosensitive pattern 262a as an etch mask is performed to etch the n-th conductive layer and the n-th dielectric layer. In this embodiment, for convenience of description, a case where the n-th stack layer is etched (e.g., i=n) is described. However, embodiments of the inventive concept are not limited thereto but include etching a conductive layer and/or a dielectric layer having the stacking order (i) which is greater than or equal to 2 and less than or equal to n.

The first etch process may include etch processes continuously performed. Concretely, the first etch process may include etching the n-th conductive layer 2CLna and etching the n-th dielectric layer 2DLna by using the non-photosensitive pattern 262a. The etching of the n-th conductive layer 2CLna and the etching of the dielectric layer 2DLna may be performed by, for example, an anisotropic etch process. The n-th conductive layer 2CLnb and the n-th dielectric layer 2DLnb etched by the first etch process may have sidewalls self-aligned with a sidewall of the non-photosensitive pattern 262a. By doing so, a top surface of the (n−1)-th conductive layer 2CL(n−1)a adjacent to the etched n-th dielectric layer 2DLnb may be partially exposed. In an embodiment, the conductive layers etched by the first etch process may have the same thickness.

Figure 9:
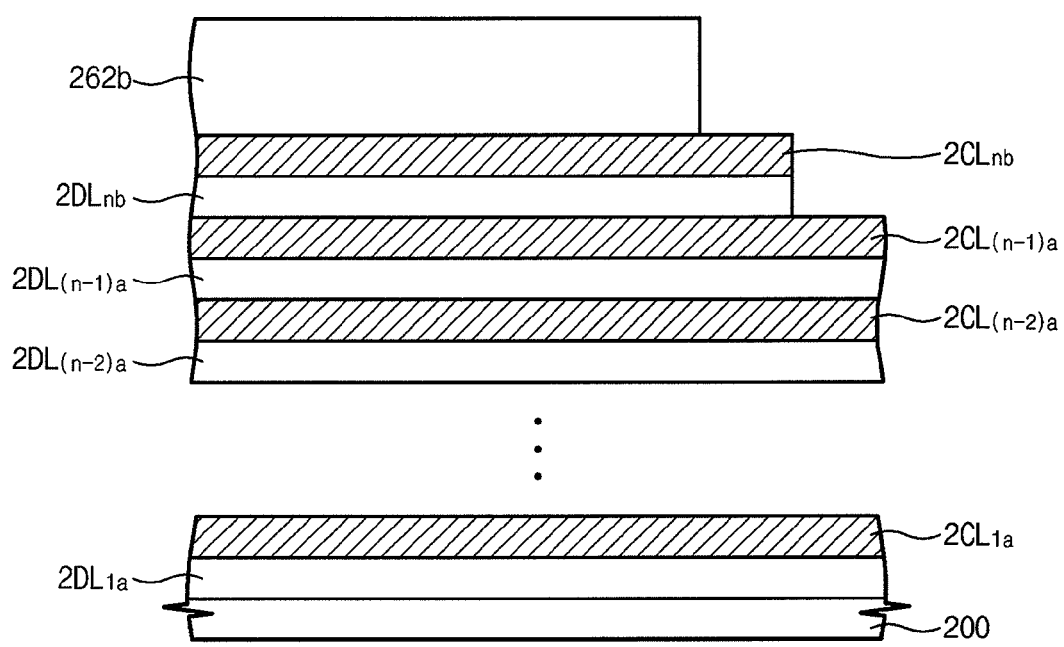

Referring to FIG. 9, the non-photosensitive pattern 262a may be etched. The etching of the non-photosensitive pattern 262a may include, for example, an isotropic etch. The etched non-photosensitive pattern 262b may have a sidewall laterally moved from the sidewall of the non-photosensitive pattern 262a. As the sidewall of the non-photosensitive pattern 262a moves, a top surface of the conductive layer 2CLnb may be partially exposed.

Figure 10:
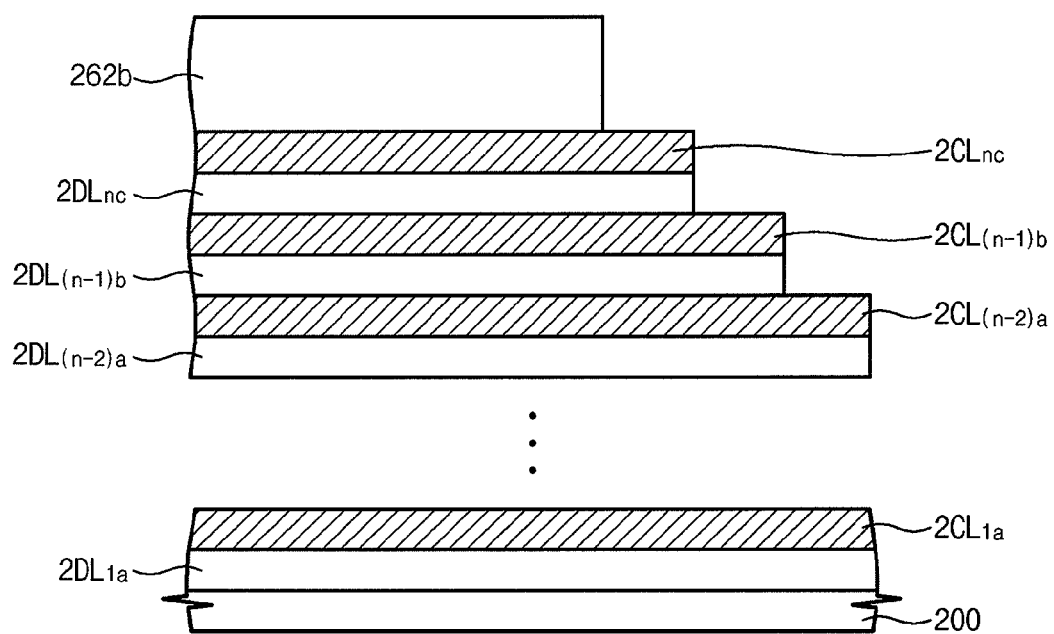

Referring to FIG. 10, a second etch process is performed with respect to the conductive layers 2CLnb, 2CL(n−1)a having the exposed top surfaces and dielectric layers 2DLnb, 2DL(n−1)a adjacent to the conductive layers 2CLnb, 2CL(n−1)a. The second etch process includes etching the conductive layers 2CLnb, 2CL(n−1)a having the exposed top surfaces and then etching dielectric layers 2DLnb, 2DL(n−1)a adjacent to the conductive layers 2CLnb, 2CL(n−1)a.

Concretely, the first etched n-th conductive layer 2CLnb may be again etched by using the etched non-photosensitive pattern 262b as an etch mask. The n-th conductive layer 2CLnc etched by the second etch process may have a sidewall self-aligned with the etched non-photosensitive pattern 262b. While the n-th conductive layer 2CLnb is etched, the (n−1)-th conductive layer 2CL(n−1)a may also be etched together therewith. The sidewall of the etched (n−1)-th conductive layer 2CL(n−1)b may be self-aligned with the sidewall of the n-th dielectric layer 2DLnb.

Thereafter, the n-th dielectric layer 2DLnb may be etched. While the n-th dielectric layer 2DLnb is etched, the (n−1)-th dielectric layer DL(n−1)a may also be etched together therewith. By doing so, the sidewall of the etched n-th dielectric layer 2DLnc is self-aligned with the sidewall of the etched n-th conductive layer 2CLnc. Also, the sidewall of the etched (n−1)-th dielectric layer 2DL(n−1)b is self-aligned with the sidewall of the etched (n−1)-th conductive layer 2CL(n−1)b.

In an embodiment, the conductive layers etched by the second etch process may have the same thickness. Also, the conductive layers etched by the second etch process may have a thickness which is the same as the conductive layers etched by the first etch process.

Thereafter, the etching of the non-photosensitive pattern 262b and the etching of the conductive layers and the dielectric layers using the non-photosensitive pattern as an etch mask are repeatedly performed as aforementioned. The non-photosensitive pattern 262b may be removed by repeating two or more etch processes.

Figure 11:
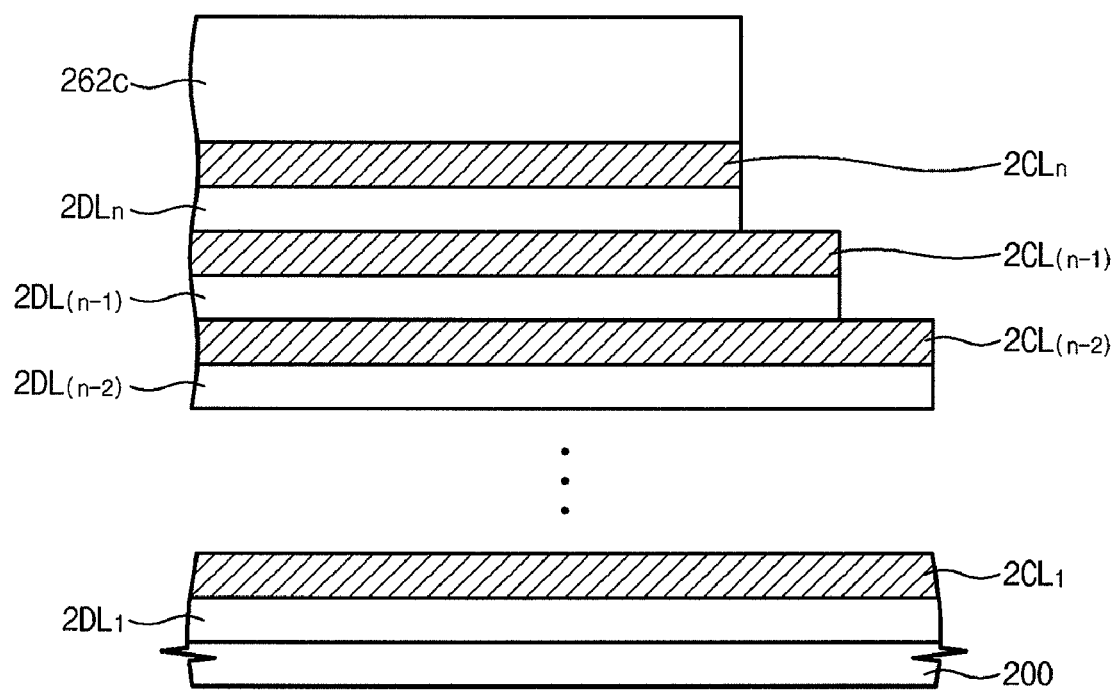

Referring to FIG. 11, by the foregoing two or more etch processes, stepwise conductive layers 2CLn, 2CLn−1, 2CLn−2, . . . , 2CL1 and stepwise dielectric layers 2DLn, 2DLn−1, 2DLn−2, . . . , 2DL1 are formed. Top surfaces of the respective conductive layers 2CLn, 2CLn−1, 2CLn−2, . . . , 2CL1 may be partially exposed. The exposed top surfaces may be interconnection contact regions for the respective conductive layers 2CLn, 2CLn−1, 2CLn−2, . . . , 2CL1. Areas of the interconnection contact regions may be determined based upon, for example, thicknesses of contacts connected with the conductive layers and other process margins. The areas of the interconnection contact regions may be adjusted by, for example, an etched thickness of the non-photosensitive pattern. Concretely, the top surface area of the conductive layer exposed by the etching of the non-photosensitive pattern may correspond to the area of the interconnection contact region.

The conductive layers 2CLn, 2CLn−1, 2CLn−2, . . . , 2CL1 and the dielectric layers 2DLn, 2DLn−1, 2DLn−2, . . . , 2DL1 may have, for example, a stepwise shape. For example, the n-th conductive layer 2CLn and the n-th dielectric layer 2DLn constitute an n-th layer, and the (n−1)-th conductive layer 2CL(n−1) and the (n−1)-th dielectric layer DL(n−1) having a sidewall laterally protruded from the sidewall of the n-th layer may be disposed below the n-th layer.

Figure 12:
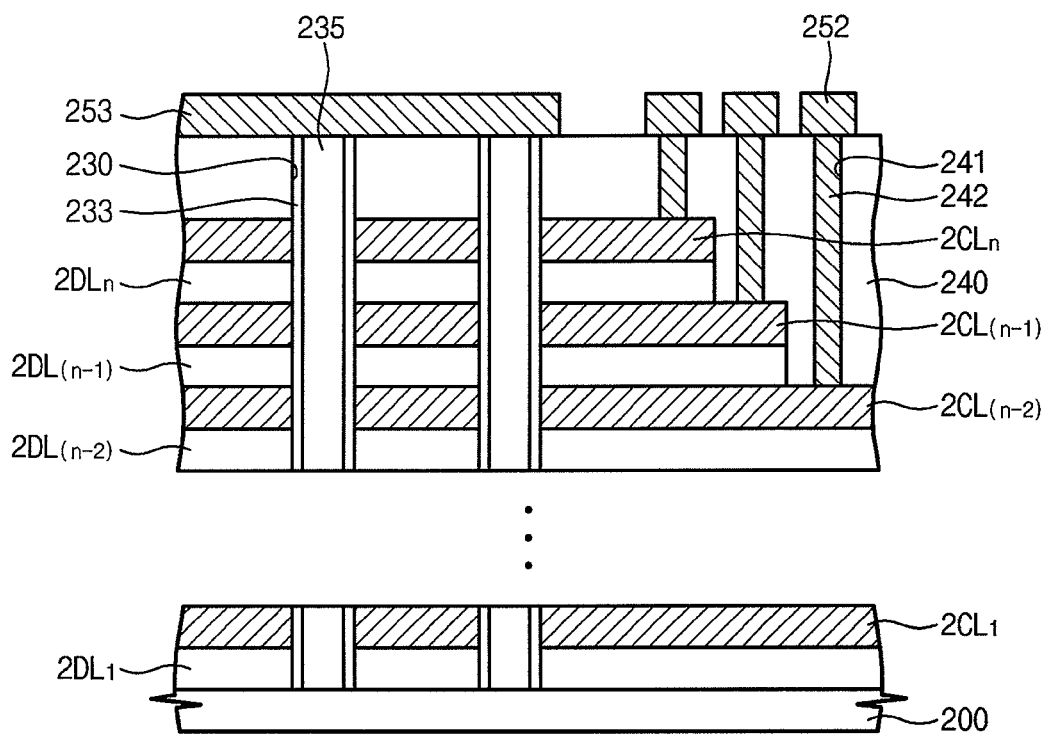

Referring to FIG. 12, an interlayer dielectric 240 covering the conductive layers 2CLn, 2CLn−1, 2CLn−2, . . . , 2CL1 and the dielectric layers 2DLn, 2DLn−1, 2DLn−2, . . . , 2DL1 is formed. An openings 230 penetrating the interlayer dielectric 240, the conductive layers 2CLn, 2CLn−1, 2CLn−2, . . . , 2CL1 and the dielectric layers 2DLn, 2DLn−1, 2DLn−2, . . . , 2DL1 is formed.

A data storage pattern 233 is formed on a sidewall of the opening 230. The data storage pattern 233 may include a blocking barrier adjacent to the sidewall of the opening 230, a charge storage layer on the blocking barrier, and a tunnel barrier on the charge storage layer. An active pattern 235 may be formed in the opening 230 in which the data storage pattern 233 is formed. The active pattern 235 may include, for example, a Group 4A element. The Group 4A element may have, for example, a single crystalline or polycrystalline state. Unlike in the drawings, the active pattern 235 may not fully fill the opening 230. In this case, the active pattern 235 may be formed conformally on a sidewall of the data storage pattern 233 and a bottom of the opening 230 to define an inner space. The inner space may be filled with an insulating material.

By partially removing the interlayer dielectric 240, contact holes 241 exposing the interconnection contact regions of the conductive layers are formed. Interconnection contacts 242 are formed by filling insides of the contact holes 241 with a conductive material. Thereafter, interconnections 253, 252 may be formed on the active pattern 235 and the interconnection contacts 242.

A nonvolatile memory device according to an embodiment of the inventive concept will now be described with reference to FIG. 12. Contents previously described with reference to FIGS. 7 through 12 may be partially omitted.

A plurality of conductive layers 2CLn, 2CLn−1, 2CLn−2, . . . , 2CL1 and a plurality of dielectric layers 2DLn, 2DLn−1, 2DLn−2, . . . , 2DL1 are alternatingly stacked on a substrate 200. The plurality of conductive layers 2CLn, 2CLn−1, 2CLn−2, . . . , 2CL1 may have different widths. The plurality of conductive layers 2CLn, 2CLn−1, 2CLn−2, . . . , 2CL1 and the plurality of dielectric layers 2DLn, 2DLn−1, 2DLn−2, . . . , 2DL1 may be stacked, for example, in a stepwise shape. The conductive layer and the dielectric layer having the same stacking order may have the same width. The plurality of conductive layers 2CLn, 2CLn−1, 2CLn−2, . . . , 2CL1 may function as gate electrodes of a nonvolatile memory device. The plurality of dielectric layers 2DLn, 2DLn−1, 2DLn−2, . . . , 2DL1 may be intergate dielectrics electrically isolating the gate electrodes.

Each of the plurality of conductive layers 2CLn, 2CLn−1, 2CLn−2, . . . , 2CL1 may have an exposed edge top surface. The exposed edge top surface may be an interconnection contact region for each of the plurality of conductive layers 2CLn, 2CLn−1, 2CLn−2, . . . , 2CL1.

The plurality of conductive layers 2CLn, 2CLn−1, 2, . . . , 2CL1 and the plurality of dielectric layers 2DLn, 2DLn−1, 2DLn−2, ..., 2DL1 may be covered by an interlayer dielectric 240. The interlayer dielectric 240 may cover the uppermost layer among the plurality of conductive layers 2CLn, 2CLn−1, 2CLn−2, ..., 2CL1 and the plurality of dielectric layers 2DLn, 2DLn−1, 2DLn−2, ..., 2DL1.

An active pattern 235 penetrating the interlayer dielectric 240, the plurality of conductive layers 2CLn, 2CLn−1, 2CLn−2, ..., 2CL1 and the plurality of dielectric layers 2DLn, 2DLn−1, 2DLn−2, ..., 2DL1 is disposed on the substrate 200. The active pattern 235 may extend upward from a top surface of the substrate 200.

A data storage pattern 233 is interposed between the active pattern 235 and the plurality of conductive layers 2CLn, 2CLn−1, 2CLn−2, ..., 2CL1. The data storage pattern 233 may include a blocking barrier adjacent to the plurality of conductive layers 2CLn, 2CLn−1, 2CLn−2, ..., 2CL1, a tunnel barrier adjacent to the active pattern 235, and a charge storage layer between the blocking barrier and the tunnel barrier. One end of the active pattern 235 may be electrically connected with the substrate 200, and the other end thereof may be electrically connected with a bit line 253 on the interlayer dielectric 240.

Figure 13:
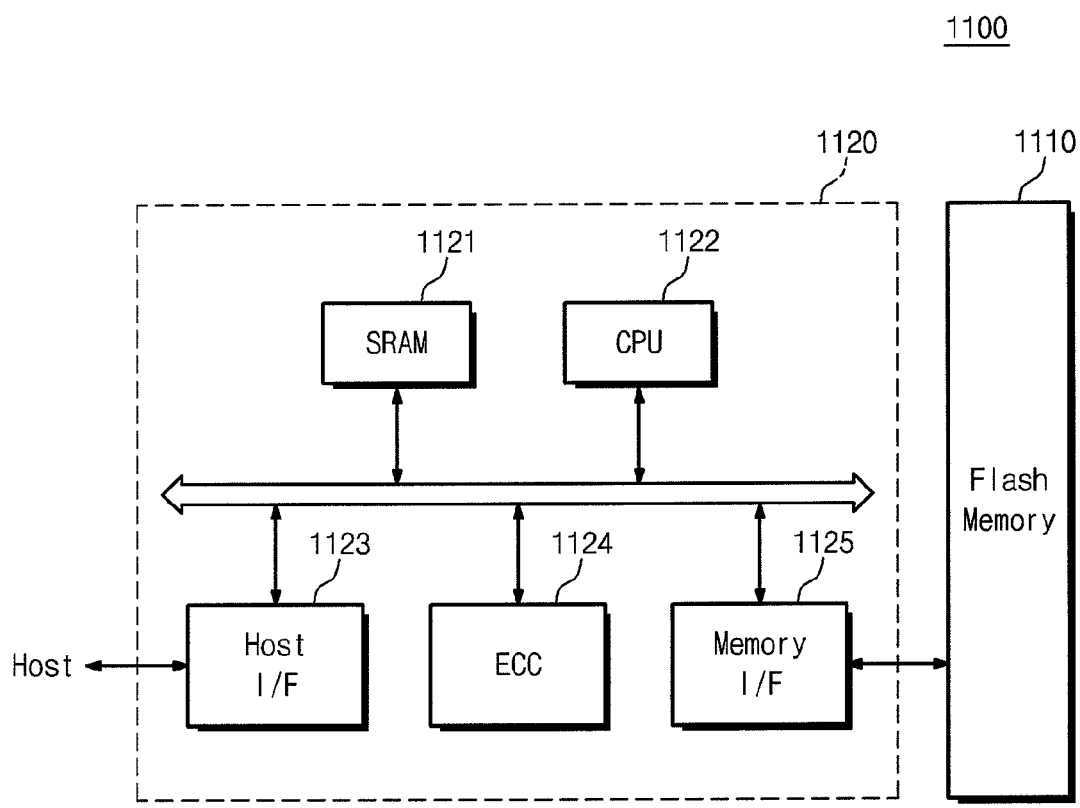
FIGS. 13 and 14 are block diagrams for describing devices to which an exemplary embodiment of the inventive concept is applied.

An application example of the embodiments of the inventive concept will be described with reference to FIG. 13. FIG. 13 is a block diagram of a memory card 1100 provided with a nonvolatile memory device according to the embodiments of the inventive concept. In this application example, the nonvolatile memory device may be applied to a flash memory 1110. A nonvolatile memory device according to embodiments of the inventive concept is built into the memory card 1100 for supporting a large-scale data storage capacity. The memory card 110 according to this application example may include, for example, a memory controller 1120 controlling all data exchange between a host and the flash memory 1110.

The memory controller 1120 may include, for example, a processing unit 1122 controlling the operation of the memory card 1100, SRAM 1120, an error correction block (ECC) 1124, a host interface 1123 and a memory interface 1125. The SRAM 1121 may be used as an operating memory of the processing unit 1122. The host interface 1123 may include data exchange protocol of the host that is connected to the memory card 1100. The error correction block (ECC) 1124 may detect and correct an error included in data read from the flash memory 1110. The memory interface 1125 may interface the flash memory 1110. The processing unit 1122 may control the overall control operation for data exchange of the memory controller 1120. The memory card 1100 according this application example can provide a system having high reliability due to enhanced reliability of the flash memory according to embodiments of the inventive concept.

Figure 14:
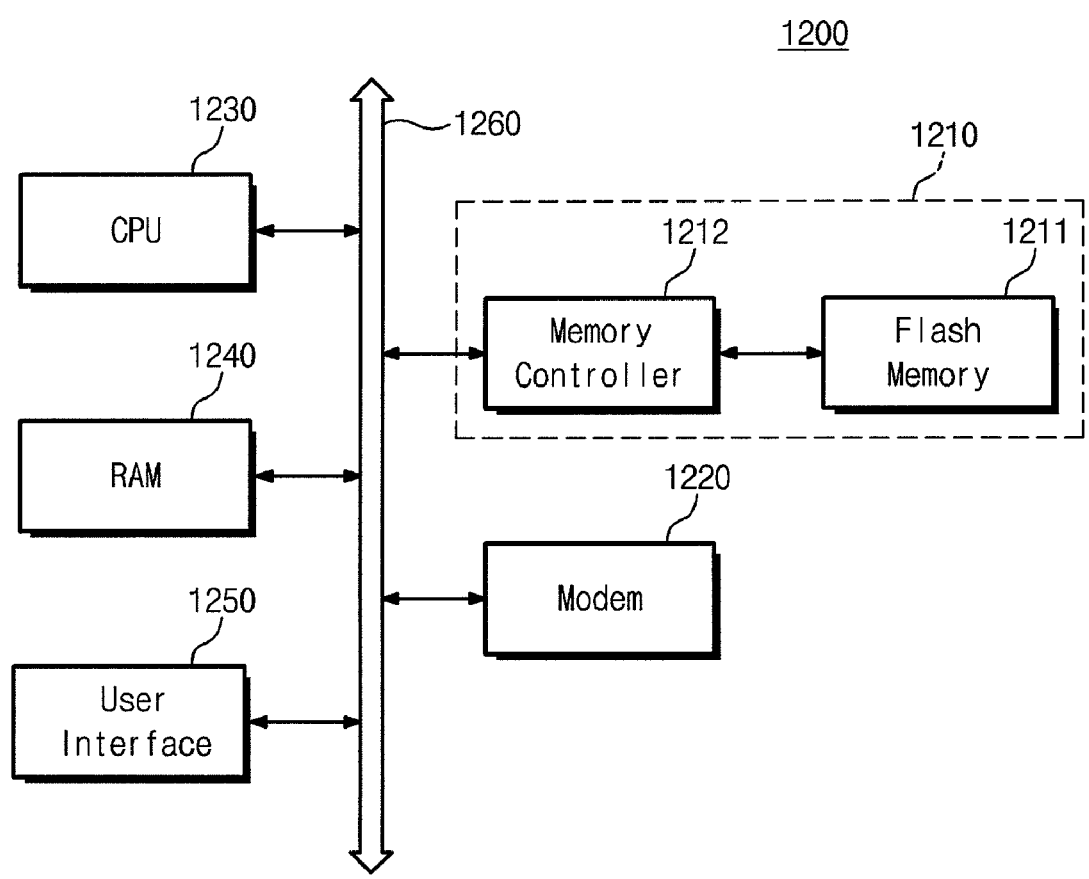

FIG. 14 is a block diagram for describing another application example of a nonvolatile memory device according to embodiments of the inventive concept. Concretely, FIG. 14 is a block diagram illustrating an information processing system 1200 including a memory system 1210. In this application example, a nonvolatile memory device according to the embodiments of the inventive concept may be included in the memory system 1210. The memory system 1210 according to embodiments of the inventive concept may be built into, for example, an information processing system such as a mobile device and a desktop computer. The information processing system 1200 according to this application example may include, for example, the memory system 1210, a modem 1220, a central processing unit (CPU) 1230, RAM 1240, and a user interface 1250 that are electrically connected to a system bus 1260. Data processed by the CPU 1230 or external input data may be stored in the memory system 1210. In this application example, the memory system 1210 may be configured with, for example, a semiconductor disk device (SSD). In this case, the information processing system 1200 can stably store high-capacity data in the memory system 1210. Also, as the reliability of the foregoing nonvolatile memory device is improved, the memory system 1210 can save resources consumed in error correction, thus providing a high-speed data exchange function to the information processing system 1200.

Also, nonvolatile memory devices according to embodiments of the inventive concept may be mounted in various types of packages. Examples of the packages of the nonvolatile memory devices according to the inventive concept include but are not limited to Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Faun, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and Wafer-level Processed Stack Package (WSP).

According to the embodiments of the inventive concept, conductive layers and dielectric layers may be etched by using a non-photosensitive pattern and an etched non-photosensitive pattern as an etch mask. As the etched amount of the non-photosensitive pattern is readily adjusted, it is possible to readily adjust widths of the conductive layers and the dielectric layers etched by adjusting the etched amount. Also, the high hardness of the non-photosensitive pattern makes it possible to etch the non-photosensitive pattern precisely in a desired shape. Therefore, the accuracy of the etch process using the etched non-photosensitive pattern as an etch mask can be enhanced significantly.

Having described embodiments of the inventive concept it is further noted that it is readily apparent to those skilled in the art that various substitutions, modifications and changes may be made without departing from the scope and spirit of the invention which is defined by the metes and bounds of the appended claims.

What is claimed is:

1. A method of forming a nonvolatile memory device, comprising:
    alternatingly stacking n number of dielectric layers and n number of conductive layers on a substrate, wherein n>2, and n is a natural number;
    forming a photosensitive pattern on the alternatingly stacked dielectric layers and conductive layers;
    forming a non-photosensitive pattern on the alternatingly stacked dielectric layers and conductive layers, wherein the non-photosensitive pattern is formed in a spacer shape on a sidewall of the photosensitive pattern;
    etching an i-th conductive layer and an i-th dielectric layer by using the non-photosensitive pattern as an etch mask, wherein $2 \leq i \leq n$, and i is a natural number indicating a stacking order of the conductive layers and the dielectric layers;
    laterally etching a sidewall of the non-photosensitive pattern; and
    etching the i-th conductive layer, (i−1)-th conductive layer, i-th dielectric layer and (i−1)-th dielectric layer by using the etched non-photosensitive pattern as an etch mask.

2. The method of claim 1, wherein the non-photosensitive pattern has a hardness which is higher than a hardness of the photosensitive pattern.

3. The method of claim 1, wherein the non-photosensitive pattern is formed at room temperature.

4. The method of claim 1, wherein the laterally etching of the sidewall of the non-photosensitive pattern and the etching of the conductive layers and the dielectric layers using the etched non-photosensitive pattern as an etch mask are repeatedly performed until the sidewall of the photosensitive pattern becomes coplanar with a sidewall of the uppermost conductive layer or dielectric layer.

5. The method of claim 1, further comprising:
   forming an active pattern which penetrates the dielectric layers and the conductive layers to extend upward from a surface of the substrate; and
   forming a data storage pattern between the active pattern and the conductive layers.

6. The method of claim 1, wherein the non-photosensitive pattern is an inorganic dielectric pattern.

7. The method of claim 1, wherein the etching of the non-photosensitive pattern comprises isotropically etching the non-photosensitive pattern.

8. The method of claim 1, wherein the forming of the non-photosensitive pattern comprises:
   forming a non-photosensitive layer covering the photosensitive pattern; and
   anisotropically etching the non-photosensitive layer until a top surface of the photosensitive pattern is exposed.

9. The method of claim 8, wherein the non-photosensitive layer has a thickness which is equal to a sum of thicknesses of the alternatingly stacked dielectric layers and conductive layers.

10. A method of forming a nonvolatile memory device, comprising:
    alternatingly stacking n number of dielectric layers and n number of conductive layers on a substrate, wherein n>2, and n is a natural number;
    forming a non-photosensitive pattern on the alternatingly stacked dielectric layers and conductive layers;
    etching an i-th conductive layer and an i-th dielectric layer by using the non-photosensitive pattern as an etch mask, wherein $2 \leq i \leq n$, and i is a natural number indicating a stacking order of the conductive layers and the dielectric layers;
    laterally etching a sidewall of the non-photosensitive pattern;
    etching the i-th conductive layer, (i−1)-th conductive layer, i-th dielectric layer and (i−1)-th dielectric layer by using the etched non-photosensitive pattern as an etch mask;
    foaming an interlayer dielectric covering the etched conductive layers and the etched dielectric layers;
    forming an opening penetrating the interlayer dielectric, the conductive layers and the dielectric layers;
    forming a data storage pattern on a sidewall of the opening;
    forming an active pattern in the opening in which the data storage pattern is formed;
    forming interconnection contacts by partially removing the interlayer dielectric to form contact holes therein and filling an inside of the contact holes with a conductive material; and
    forming interconnections on the active pattern and the interconnection contacts.

11. The method of claim 10, wherein the data storage pattern includes a blocking barrier adjacent to the sidewall of the opening, a charge storage layer on the blocking barrier, and a tunnel barrier on the charge storage layer.

12. The method of claim 10, wherein the active pattern substantially fills the opening penetrating the interlayer dielectric.

13. The method of claim 10, wherein the active pattern is conformally formed on a sidewall of the data storage pattern and a bottom of the opening to define an inner space, and wherein the inner space is filled with an insulating material.

14. The method of claim 10, wherein the active pattern includes a Group 4A element.

15. The method of claim 14, wherein the Group 4A element of the active pattern is in one of a crystalline state or a polycrystalline state.

16. The method of claim 10, further comprising forming a photosensitive pattern on the alternatingly stacked dielectric layers and conductive layers, wherein the non-photosensitive pattern is formed in a spacer shape on a sidewall of the photosensitive pattern.

17. The method of claim 16, wherein the laterally etching of the sidewall of the non-photosensitive pattern and the etching of the conductive layers and the dielectric layers using the etched non-photosensitive pattern as an etch mask are repeatedly performed until the sidewall of the photosensitive pattern becomes coplanar with a sidewall of the uppermost conductive layer or dielectric layer.

18. The method of claim 16, wherein the forming of the non-photosensitive pattern comprises:
    forming a non-photosensitive layer covering the photosensitive pattern; and
    anisotropically etching the non-photosensitive layer until a top surface of the photosensitive pattern is exposed.

19. The method of claim 18, wherein the non-photosensitive layer has a thickness which is equal to a sum of thicknesses of the alternatingly stacked dielectric layers and conductive layers.

* * * * *